United States Patent
Guo

(10) Patent No.: US 11,862,641 B2
(45) Date of Patent: Jan. 2, 2024

(54) ARRAY SUBSTRATE AND MANUFACTURING METHOD THEREOF

(71) Applicant: TCL CHINA STAR OPTOELECTRONICS TECHNOLOGY CO., LTD., Guangdong (CN)

(72) Inventor: Li Guo, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 481 days.

(21) Appl. No.: 16/973,312

(22) PCT Filed: Nov. 27, 2020

(86) PCT No.: PCT/CN2020/132031
§ 371 (c)(1),
(2) Date: Dec. 8, 2020

(87) PCT Pub. No.: WO2022/057088
PCT Pub. Date: Mar. 24, 2022

(65) Prior Publication Data
US 2022/0352213 A1 Nov. 3, 2022

(30) Foreign Application Priority Data
Sep. 18, 2020 (CN) .......................... 202010989556.3

(51) Int. Cl.
*H01L 27/14* (2006.01)
*H01L 27/12* (2006.01)
*H01L 25/16* (2023.01)

(52) U.S. Cl.
CPC ........ *H01L 27/1222* (2013.01); *H01L 25/167* (2013.01); *H01L 27/127* (2013.01); *H01L 27/1255* (2013.01)

(58) Field of Classification Search
CPC ............... H01L 27/1222; H01L 25/167; H01L 27/1255; H01L 27/127; H01L 27/1214; H01L 27/1259; G02F 1/1362; G02F 2201/58
USPC ..................................................... 257/59, 72
See application file for complete search history.

(56) References Cited

U.S. PATENT DOCUMENTS 7,436,038 B2 * 10/2008 Engelmann ....... H01L 27/14643
257/E27.133
11,469,336 B2 * 10/2022 Du ...................... H01L 31/1884

FOREIGN PATENT DOCUMENTS

| CN | 101068026 A | 11/2007 |
| CN | 104679356 A | 6/2015 |
| CN | 109801946 A | 5/2019 |
| CN | 111128027 A | 5/2020 |
| JP | 10-197647 A | * 7/1998 |
| WO | 03071342 A1 | 8/2003 |

* cited by examiner

*Primary Examiner* — Tan N Tran

(57) ABSTRACT

In the present disclosure, a photodiode structure is used as a photosensor in an array substrate. The semiconductor structure in the photosensor includes a N-type heavily doped amorphous silicon layer, an amorphous silicon layer, and a P-type heavily doped amorphous silicon layer, thereby realizing the integration of photosensors into large-sized devices, the enhancement of device sensitivity, and the reduction of costs.

12 Claims, 5 Drawing Sheets

ARRAY SUBSTRATE AND MANUFACTURING METHOD THEREOF

FIELD OF INVENTION

The present disclosure relates to the field of display technologies, and more particularly, to an array substrate and a manufacturing method thereof.

BACKGROUND OF INVENTION

After decades of development, liquid crystal display (LCD) technology has become very mature. In the future development, the integration of photosensors is an important direction for the development of LCD technology. By integrating the photosensors into the display screen, the application scenarios of the display screen may further be expanded. For example, fingerprint recognition, palmprint recognition, somatosensory recognition, laser interaction and other functions can all be realized by photosensors.

Currently, how to enhance the sensitivity of the photosensors and improve the compatibility of the photosensor with large-size display technology has become an important direction for developing the LCD technology.

SUMMARY OF INVENTION

Technical Problems

An array substrate and a manufacturing method thereof are provided by the present disclosure to effectively enhance the sensitivity of the photosensor and improve the compatibility of the photosensor with large-size display technology.

Technical Solutions

In order to achieve the above effects, the technical solutions provided by the present disclosure are as follow:
An array substrate, including:
a substrate;
a photosensitive unit disposed on the substrate, wherein the photosensitive unit includes a storage capacitor, a switch thin film transistor, and a photosensor located between storage capacitor and the switch thin film transistor;
wherein the photosensor is a photodiode structure, and a semiconductor structure in the photosensor includes a N-type heavily doped amorphous silicon layer, an amorphous silicon layer, and a P-type heavily doped amorphous silicon layer arranged in layers.

In the array substrate of the present disclosure, the array substrate further includes:
a first electrode layer disposed on the substrate, wherein the first electrode layer includes a first electrode, a second electrode, and a third electrode arranged in spaces;
a gate insulating layer disposed on the first electrode layer;
a semiconductor layer disposed in the gate insulating layer, wherein the semiconductor layer includes a first semiconductor layer and a second semiconductor layer, the first semiconductor layer is disposed on the first electrode and the third electrode, and the second semiconductor layer is disposed on the second electrode;
a second electrode layer disposed on the first semiconductor layer, wherein the second electrode layer includes a fourth electrode, a drain, and a source, the fourth electrode is disposed on the first electrode, and the drain and the source are disposed on two opposite edge regions of the third electrode;
an insulating layer disposed on the semiconductor layer; and
a transparent electrode layer disposed on the insulating layer, wherein the transparent electrode layer includes a first transparent electrode and a second transparent electrode, the first transparent electrode is connected to the first electrode, and the second transparent electrode is connected to the second electrode and the drain.

In the array substrate of the present disclosure, a thickness of the first electrode layer and a thickness of the second electrode layer both ranges from 500 to 10000 Å.

In the array substrate of the present disclosure, the photosensor includes the second electrode, the second semiconductor layer, and the first transparent electrode arranged in layers, wherein the second semiconductor layer is a multiple-layered structure including the N-type heavily doped amorphous silicon layer, the amorphous silicon layer, and the P-type heavily doped amorphous silicon layer arranged in layers.

In the array substrate of the present disclosure, the storage capacitor includes the first electrode, the first semiconductor layer, and the fourth electrode arranged in layers, wherein the first semiconductor layer is a multiple-layered structure including the amorphous silicon layer and the N-type heavily doped amorphous silicon layer arranged in layers.

In the array substrate of the present disclosure, the switch thin film transistor includes the third electrode, the first semiconductor layer, the drain, and the source.

In the array substrate of the present disclosure, the third electrode of the switch thin film transistor is connected to a scan signal, the source is connected to a readout signal, the drain is connected to the second electrode of the photosensor and the fourth electrode of the storage capacitor;
the first electrode of the storage capacitor is connected to a low-potential power source and the first transparent electrode of the photosensor, the fourth electrode of the storage capacitor is connected to the drain of the switch thin film transistor and the second electrode of the photosensor.

In the array substrate of the present disclosure, an opening hole partially exposing the second electrode is defined by the gate insulating layer and the insulating layer, and the second semiconductor layer contacts the second electrode through the opening hole.

In the array substrate of the present disclosure, the array substrate further includes: a first barrier layer disposed on the first electrode layer, wherein the first barrier layer includes a first sub-barrier layer disposed on the first electrode, a second sub-barrier layer disposed on the second electrode, and a third sub-barrier layer disposed on the third electrode.

In the array substrate of the present disclosure, a thickness of the first sub-barrier layer, a thickness of the second sub-barrier layer, and a thickness of the third sub-barrier layer all ranges from 50 to 1000 Å.

In the array substrate of the present disclosure, the array substrate further includes: a second barrier layer disposed on the second electrode layer, wherein the second barrier layer includes a fourth sub-barrier layer disposed on the fourth electrode, a fifth sub-barrier layer disposed on the drain, and a sixth sub-barrier layer disposed on the source.

In the array substrate of the present disclosure, a thickness of the fourth sub-barrier layer, a thickness of the fifth sub-barrier layer, and a thickness of the sixth sub-barrier layer all ranges from 50 to 1000 Å.

In the array substrate of the present disclosure, the array substrate further includes: a protective cover plate disposed opposite the substrate, wherein a light-shielding layer is disposed on a surface of the protective cover plate facing the substrate, and a spacer is disposed on a surface of the substrate facing the protective cover plate.

The present disclosure further provides a manufacturing method of an array substrate, including following steps:

step S10: forming a first metal layer on a substrate, and patterning the first metal layer to form a first electrode layer, wherein the first electrode layer includes a first electrode, a second electrode, and a third electrode arranged in spaces;

step S20: forming a gate insulating layer, a first semiconductor layer, and a second metal layer on the first electrode layer, and patterning the second metal layer and the first semiconductor layer to form a second electrode layer, wherein the second electrode layer includes a fourth electrode, a drain, and a source, the fourth electrode is disposed on the first electrode, and the drain and the source are disposed on two opposite edge regions of the third electrode;

step S30: forming a first insulating layer on the gate insulating layer, the fourth electrode, the drain, and the source, and patterning the first insulating layer and the gate insulating layer to form an opening hole partially exposing the second electrode;

step S40: forming a second semiconductor layer on an exposed portion of the second electrode;

step S50: forming a second insulating layer on the first insulating layer and the second semiconductor layer, and patterning the second insulating layer, the first insulating layer, and the gate insulating layer to form a via hole on the first electrode, a via hole on the second electrode, a via hole on the drain, and an opening hole partially exposing the second semiconductor layer;

step S60: forming a transparent electrode layer on the second insulating layer and the second semiconductor layer, and patterning the transparent electrode layer to form a first transparent electrode and a second transparent electrode, wherein the first transparent electrode is connected to the first electrode by the via hole on the first electrode, the second transparent electrode is connected to the second electrode by the via hole on the second electrode and is connected to the drain by the via hole on the drain.

In the manufacturing method of the present disclosure, the step S10 includes following steps:

step S11: providing the substrate;

step S12: depositing the first metal layer on the substrate;

step S13: depositing a first metal barrier layer;

step S14: patterning the first metal layer and the first metal barrier layer by a mask, wherein the first metal layer is formed into a first electrode, a second electrode, and a third electrode arranged in spaces, the first metal barrier layer is formed into a first sub-barrier layer disposed on the first electrode, a second sub-barrier layer disposed on the second electrode, and a third sub-barrier layer disposed on the third electrode.

In the manufacturing method of the present disclosure, the step S20 includes following steps:

step S21: forming the gate insulating layer on the first electrode layer;

step S22: forming the first semiconductor layer on the gate insulating layer, wherein the first semiconductor layer includes a first amorphous silicon layer and a first N-type heavily doped amorphous silicon layer formed on the gate insulating layer in sequence;

step S23: depositing the second metal layer on the gate insulating layer and the first semiconductor layer;

step S24: patterning the second metal layer and the first semiconductor layer by a mask to form the second electrode layer, wherein the second electrode layer includes the fourth electrode, the drain, and the source.

In the manufacturing method of the present disclosure, the step S40 includes: forming a N-type heavily doped amorphous silicon layer, an amorphous silicon layer, and a P-type heavily doped amorphous silicon layer on the exposed portion of the second electrode in sequence.

In the manufacturing method of the present disclosure, the step S50 includes following steps:

step S51: forming the second insulating layer on the first insulating layer and the second semiconductor layer;

step S52: patterning the second insulating layer, the first insulating layer, and the gate insulating layer by a mask to form the via hole on the first electrode, the via hole on the second electrode, the via hole on the drain, and the opening hole partially exposing the second semiconductor layer.

In the manufacturing method of the present disclosure, the manufacturing method further includes:

step S70: forming a spacer on the substrate;

step S80: forming a protective cover plate on a surface of the spacer away from the substrate.

In the manufacturing method of the present disclosure, the manufacturing method further includes: forming a light-shielding layer on a surface of the protective cover plate facing the substrate, wherein a projection of the third electrode projected on the substrate is located within the light-shielding layer.

Beneficial Effect

In the present disclosure, a photodiode structure is used as a photosensor in an array substrate. The semiconductor structure in the photosensor includes a N-type heavily doped amorphous silicon layer, an amorphous silicon layer, and a P-type heavily doped amorphous silicon layer, thereby realizing the integration of photosensors into large-sized devices, the enhancement of device sensitivity, and the reduction of costs.

DETAILED DESCRIPTION OF PREFERRED EMBODIMENTS

An array substrate and a manufacturing method thereof are provided by the present disclosure. In order to make the objects, technical solutions, and effects of the present disclosure clearer and more specific, the present disclosure is described in further detail below with reference to the embodiments accompanying the drawings. It should be understood that the specific embodiments described here are only used to explain the present disclosure, and not used to limit the present disclosure.

Embodiment 1

Figure 1:
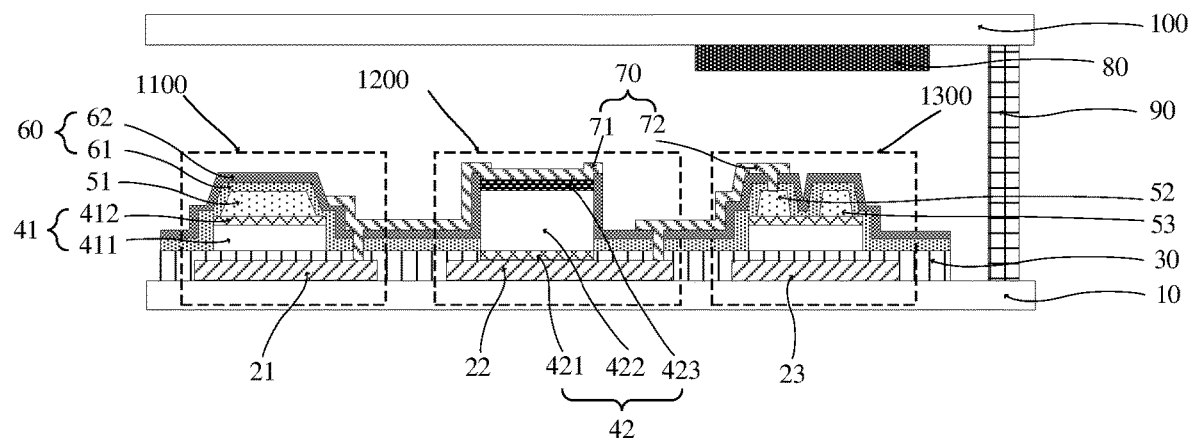
FIG. 1 is a structural schematic diagram of an array substrate provided by an embodiment of the present disclosure.

Please refer to FIG. 1, which is a structural schematic diagram of an array substrate provided by an embodiment of the present disclosure.

In the present embodiment, the array substrate includes a substrate 10, a photosensitive unit disposed on the substrate 10, and the photosensitive unit includes a storage capacitor 1100, a switch thin film transistor 1300, and a photosensor 1200 located between storage capacitor 1100 and the switch thin film transistor 1300, wherein the photosensor 1200 is a photodiode structure.

The array substrate further includes a first electrode layer, a gate insulating layer 30, a semiconductor layer, a second electrode layer, an insulating layer 60, and a transparent electrode layer 70 which are sequentially stacked on the substrate 10.

In the present embodiment, the substrate 10 is a PI substrate, which is mainly made of polyimide, and polyimide can effectively improve the light transmittance.

In the present embodiment, the first electrode layer includes a first electrode 21, a second electrode 22, and a third electrode 23 arranged in spaces.

The material of the first electrode layer includes, but is not limited to, metals such as copper, aluminum, and silver. The thickness of the first electrode layer ranges from 500 to 10000 Å, which is not limited in the present embodiment.

In the present embodiment, the array substrate further includes a first barrier layer disposed on the first electrode layer, wherein the first barrier layer includes a first sub-barrier layer disposed on the first electrode 21, a second sub-barrier layer disposed on the second electrode 22, and a third sub-barrier layer disposed on the third electrode 23.

The materials of the first sub-barrier layer, the second sub-barrier layer, and the third sub-barrier layer include, but are not limited to, metals such as molybdenum, titanium, and molybdenum-titanium alloy. The thickness of the first sub-barrier layer, the thickness of the second sub-barrier layer, and the thickness of the third sub-barrier layer all ranges from 50 to 1000 Å, which are not limited in the present embodiment.

In the present embodiment, the semiconductor layer includes a first semiconductor layer 41 and a second semiconductor layer 42, the first semiconductor layer 41 is disposed on the first electrode 21 and the third electrode 23, and the second semiconductor layer 42 is disposed on the second electrode 22.

In the present embodiment, the first semiconductor layer 41 is a multiple-layered structure including a first amorphous silicon layer 411 and a first N-type heavily doped amorphous silicon layer 412. The second semiconductor layer 42 is a multiple-layered structure including a second N-type heavily doped amorphous silicon layer 421, a second amorphous silicon layer 422, and a P-type heavily doped amorphous silicon layer 423 arranged in layers.

In the present embodiment, the second electrode layer includes a fourth electrode 51, a drain 52, and a source 53, the fourth electrode 51 is disposed on the first electrode 21, and the drain 52 and the source 53 are disposed on two opposite edge regions of the third electrode 23.

The material of the second electrode layer 20 includes, but is not limited to, metals such as copper, aluminum, and silver. The thickness of the second electrode layer 20 ranges from 500 to 10000 Å, which is not limited in the present embodiment.

In the present embodiment, the array substrate further includes a second barrier layer disposed on the second electrode layer, wherein the second barrier layer includes a fourth sub-barrier layer disposed on the fourth electrode 51, a fifth sub-barrier layer disposed on the drain 52, and a sixth sub-barrier layer disposed on the source 53.

The materials of the fourth sub-barrier layer, the fifth sub-barrier layer, and the sixth sub-barrier layer include, but are not limited to, metals such as molybdenum, titanium, and molybdenum-titanium alloy. The thickness of the fourth sub-barrier layer, the thickness of the fifth sub-barrier layer, and the thickness of the sixth sub-barrier layer all ranges from 50 to 1000 Å, which are not limited in the present embodiment.

In the present embodiment, the insulating layer 60 includes a first insulating layer 61 and a second insulating layer 62 arranged in layers, which are disposed on the first semiconductor layer 41, the second semiconductor layer 42, and the gate insulating layer 30.

In the present embodiment, an opening hole partially exposing the second electrode 22 is defined by the gate insulating layer 30, the first insulating layer 61 and the second insulating layer 62, and the second semiconductor layer 42 contacts the second electrode 22 through the opening hole.

In the present embodiment, the transparent electrode layer 70 includes a first transparent electrode 71 and a second transparent electrode 72.

An opening hole partially exposing the second semiconductor layer 42 is defined by the first insulating layer 61 and the second insulating layer 62, and the first transparent electrode 71 contacts the second semiconductor layer 42 through the opening hole.

In the present embodiment, the material of the transparent electrode layer 70 includes, but is not limited to, indium tin oxide and indium zinc oxide, which is not limited in the present embodiment.

In the present embodiment, via holes are defined by the first electrode 21, the second electrode 22, and the drain 52. The first transparent electrode 71 is connected to the first electrode 21 by the via hole on the first electrode 21, the second transparent electrode 72 is connected to the second electrode 22 by the via hole on the second electrode 22 and is connected to the drain 52 by the via hole on the drain 52.

In the present embodiment, the storage capacitor 1100 includes the first electrode 21, the first semiconductor layer 41, and the fourth electrode 51 arranged in layers.

The two electrode plates of the storage capacitor 1100 are the first electrode 21 and the fourth electrode 52. The insulating dielectric layer between the two electrode plates of the storage capacitor 1100 includes, but is not limited to, the first insulating layer 61, the first amorphous silicon layer 411, and the first N-type heavily doped amorphous silicon layer 41, which is not limited in the present embodiment.

In the present embodiment, the photosensor 1200 includes the second electrode 22, the second semiconductor layer 42, and the first transparent electrode 71 arranged in layers.

In the present embodiment, the switch thin film transistor 1300 includes the third electrode 23, the first semiconductor layer 41, the drain 52, and the source 53.

Figure 2:
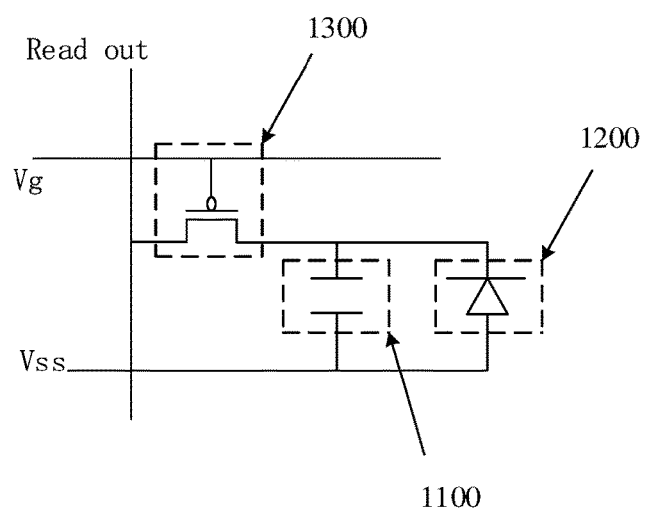
FIG. 2 is a circuit diagram of an array substrate provided by an embodiment of the present disclosure.

Please refer to FIG. 2, which is a circuit diagram of an array substrate provided by an embodiment of the present disclosure.

In the present embodiment, the third electrode 23 of the switch thin film transistor 1300 is connected to a scan signal (Vg), the source 53 is connected to a readout signal (Read out), the drain 52 is connected to the second electrode 22 of the photosensor 1200 and the fourth electrode 51 of the storage capacitor 1100.

The first electrode 21 of the storage capacitor 1100 is connected to a low-potential power source (VSS) and the first transparent electrode 71 of the photosensor 1200, the fourth electrode 51 of the storage capacitor 1100 is connected to the drain 52 of the switch thin film transistor 1300 and the second electrode 22 of the photosensor 1200.

In the present embodiment, the first transparent electrode 71 is the positive electrode of the photosensor 1200, and the second electrode 22 is the negative electrode of the photosensor 1200.

In the present embodiment, the storage capacitor 1100, the switch thin film transistor 1300, and the photosensor 120 are connected through the transparent electrode layer 70.

In the present embodiment, the array substrate further includes a protective cover plate 100 disposed opposite the substrate 10, wherein a light-shielding layer 80 is disposed on a surface of the protective cover plate 100 facing the substrate 10, and a spacer 90 is disposed on a surface of the substrate 10 facing the protective cover plate 100.

The light-shielding layer 80 corresponds to the switch thin film transistor 1300, and a projection of the third electrode 23 projected on the substrate 10 is located within the light-shielding layer 80. A projection of the light-shielding layer 80 projected on the substrate 10 does not overlap with the second electrode 22.

The spacer 90 supports the substrate 10 and the protective cover plate 100, and a projection of the spacer 90 projected on the substrate 10 does not overlap with each film layer.

In the present disclosure, a photodiode structure is used as the photosensor 1200 in the array substrate. The semiconductor structure in the photosensor includes the second N-type heavily doped amorphous silicon layer 421, the second amorphous silicon layer 422, and the P-type heavily doped amorphous silicon layer 423, thereby realizing the integration of photosensors into large-sized devices, the enhancement of device sensitivity, and the reduction of costs.

Embodiment 2

Figure 3:
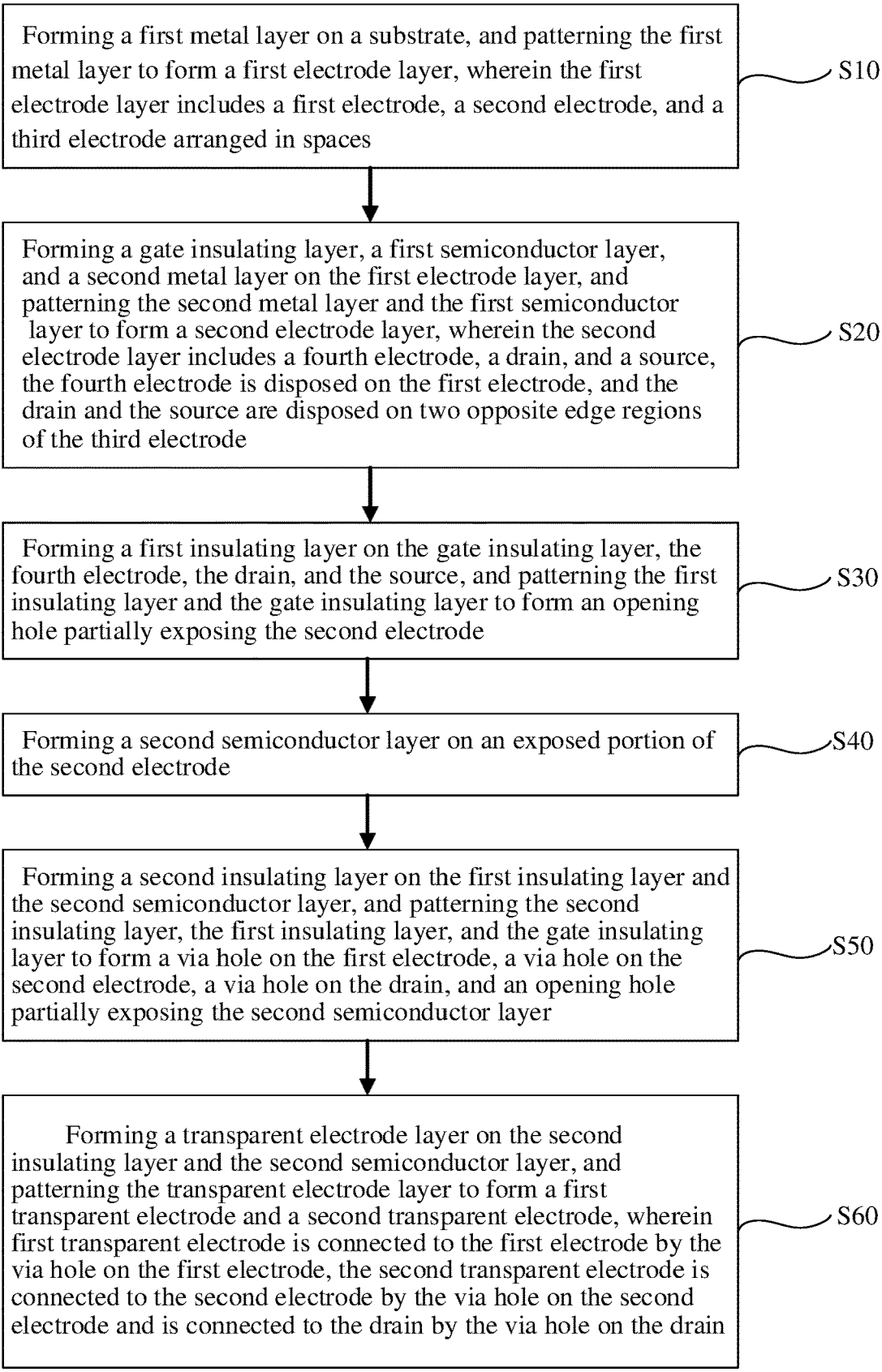
FIG. 3 is a flow chart of a manufacturing method of an array substrate provided by the present disclosure.

Please refer to FIG. 3, which is a flow chart of a manufacturing method of an array substrate provided by the present disclosure.

Figure 4A:
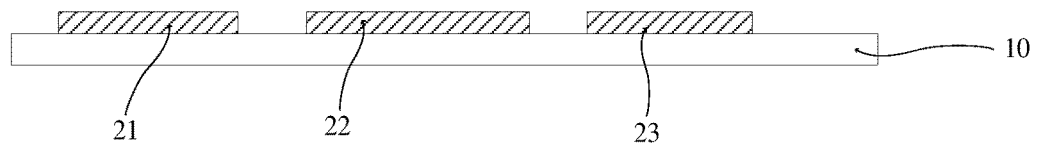
FIG. 4A to FIG. 4F are structural schematic diagrams during the manufacturing process of the array substrate provided by the present disclosure.

In the present embodiment, the manufacturing method of an array substrate includes:

Block S10: forming a first metal layer on a substrate 10, and patterning the first metal layer to form a first electrode layer, wherein the first electrode layer includes a first electrode 21, a second electrode 22, and a third electrode 23 arranged in spaces, as shown in FIG. 4A.

In the present embodiment, the thickness of the first electrode layer ranges from 500 to 10000 Å, which is not limited in the present embodiment.

In the present embodiment, the block S10 includes following blocks:

Block S11: providing the substrate 10. The substrate 10 includes, but is not limited to, a glass substrate and a flexible substrate.

Further, in the present embodiment, the substrate 10 is a flexible and transparent PI substrate, which is mainly made of polyimide, and polyimide can effectively improve the light transmittance.

Block S12: depositing the first metal layer on the substrate 10. The material of the first metal layer includes, but is not limited to, metals such as aluminum, molybdenum, titanium, copper, and alloys thereof. The method of depositing the first metal layer includes, but is not limited to, physical vapor deposition.

Block S13: depositing a first metal barrier layer. The material of the first metal barrier layer includes, but is not limited to, metals such as molybdenum, titanium, and molybdenum-titanium alloy. The thickness of the first metal barrier layer ranges from 50 to 1000 Å, which is not limited in the present embodiment.

Block S14: patterning the first metal layer and the first metal barrier layer by a mask, wherein the first metal layer is formed into a first electrode 21, a second electrode 22, and a third electrode 23 arranged in spaces, the first metal barrier layer is formed into a first sub-barrier layer disposed on the first electrode 21, a second sub-barrier layer disposed on the second electrode 22, and a third sub-barrier layer disposed on the third electrode 23.

It should be noted that, in the present embodiment, the first metal layer and the first metal barrier layer may also be deposited on the substrate 10 at the same time. In the present embodiment, the first metal layer and the first metal barrier layer are separately deposited for illustration only, which is not limited in the present embodiment.

Figure 4B:
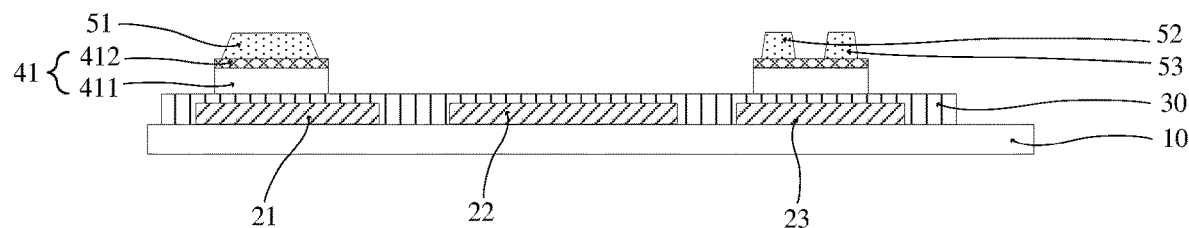

Block S20: forming a gate insulating layer 30, a first semiconductor layer 41, and a second metal layer on the first electrode layer, and patterning the second metal layer and the first semiconductor layer 41 to form a second electrode layer, wherein the second electrode layer includes a fourth electrode 51, a drain 51, and a source 53, the fourth electrode 51 is disposed on the first electrode 21, and the drain 51 and the source 53 are disposed on two opposite edge regions of the third electrode 23, as shown in FIG. 4B.

In the present embodiment, the block S20 includes:

Block S21: forming the gate insulating layer 30 on the first electrode layer. The gate insulating layer 30 completely covers the first electrode 21, the second electrode 22, and the third electrode 23. The method of forming the gate insulating layer 30 includes, but not limited to, chemical vapor deposition.

Block S22: forming the first semiconductor layer 41 on the gate insulating layer 30, wherein the first semiconductor layer 41 includes a first amorphous silicon layer 411 and a first N-type heavily doped amorphous silicon layer 412 formed on the gate insulating layer 30 in sequence.

Block S23: depositing the second metal layer on the gate insulating layer 30 and the first semiconductor layer 41. The material of the second metal layer includes, but is not limited to, metals such as aluminum, molybdenum, titanium, copper, and alloys thereof. The method of depositing the second metal layer includes, but is not limited to, physical vapor deposition.

In the present embodiment, the block S23 includes depositing a second metal barrier layer. The material of the second metal barrier layer includes, but is not limited to, metals such as molybdenum, titanium, and molybdenum-titanium alloy. The thickness of the second metal barrier layer ranges from 50 to 1000 Å, which is not limited in the present embodiment.

Block S24: patterning the second metal layer and the first semiconductor layer 41 by a mask to form the second electrode layer, wherein the second electrode layer includes the fourth electrode 51, the drain 52, and the source 53.

In the present embodiment, the thickness of the first electrode layer ranges from 500 to 10000 Å, and the patterned first semiconductor layer 41 is located on the first electrode 21 and the third electrode 23.

In the present embodiment, the block S24 includes: patterning the second metal layer, the second metal barrier layer, and the first semiconductor layer 41 by a mask, wherein the second metal layer is formed into the fourth electrode 51, the drain 52, and the source 53 arranged in spaces, and the second metal barrier layer is formed into a fourth sub-barrier layer located on the fourth electrode 51, a fifth sub-barrier layer located on the drain 52, and a sixth sub-barrier layer located on the source 53.

It should be noted that, in the present embodiment, the second metal layer and the second metal barrier layer may also be deposited on the substrate at the same time. In the present embodiment, the second metal layer and the second metal barrier layer are separately deposited for illustration only, which are not limited in the present embodiment.

In the present embodiment, the patterned first semiconductor layer 41 is located on the first electrode 21 and the third electrode 23.

Figure 4C:
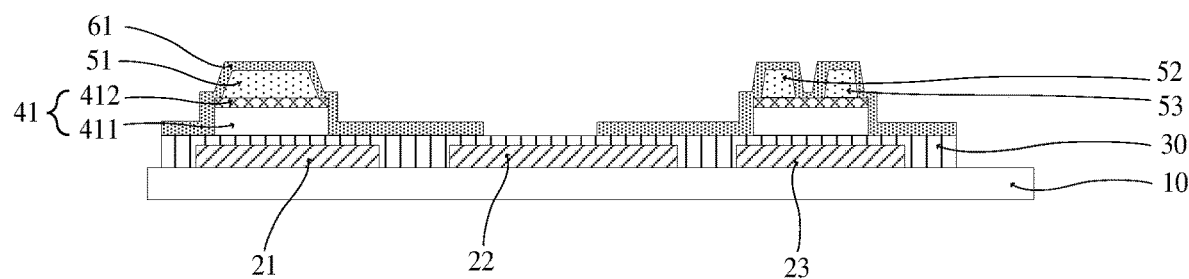

Block S30: forming a first insulating layer 61 on the gate insulating layer 30, the fourth electrode 51, the drain 52, and the source 53, and patterning the first insulating layer 61 and the gate insulating layer 30 to form an opening hole partially exposing the second electrode 22, as shown in FIG. 4C.

In the present embodiment, the method of forming first insulating layer 61 includes, but not limited to, chemical vapor deposition.

Figure 4D:
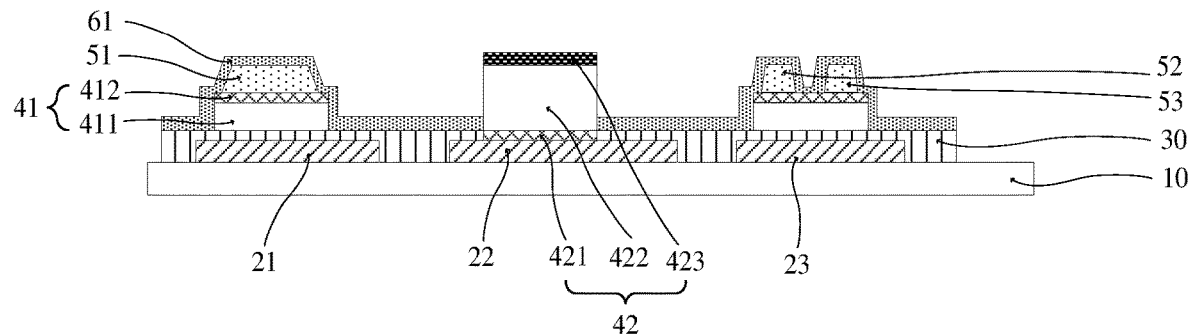

Block S40: forming a second semiconductor layer 42 on an exposed portion of the second electrode 22, as shown in FIG. 4D.

In the present embodiment, the method of forming the second semiconductor layer 42 includes, but is not limited to, chemical vapor deposition, and the process gases used include, but are not limited to, phosphine, silane, hydrogen, nitrogen, argon, and helium.

In the present embodiment, the block S40 includes: forming a second N-type heavily doped amorphous silicon layer 421, a second amorphous silicon layer 422, and a P-type heavily doped amorphous silicon layer 423 on the exposed portion of the second electrode 22 in sequence.

The second semiconductor layer 42 includes the second N-type heavily doped amorphous silicon layer 421, the second amorphous silicon layer 422, and the P-type heavily doped amorphous silicon layer 423 arranged in layers.

Figure 4E:
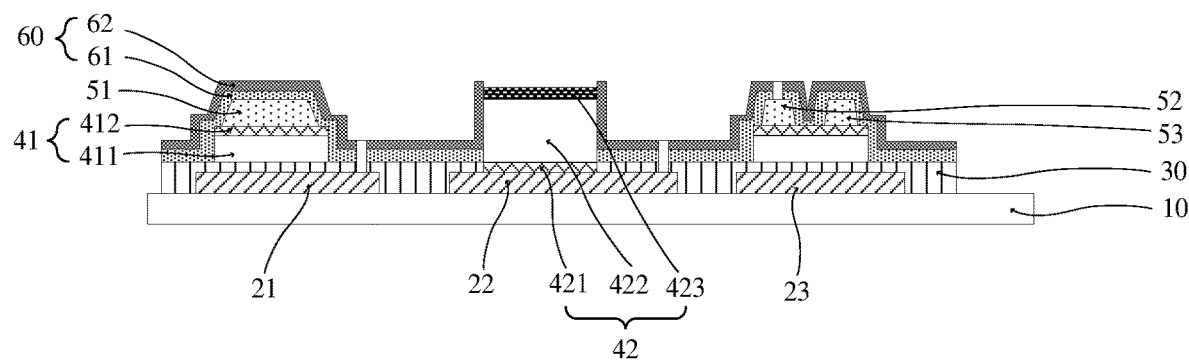

Block S50: forming a second insulating layer 62 on the first insulating layer 61 and the second semiconductor layer 42, and patterning the second insulating layer 62, the first insulating layer 61, and the gate insulating layer 30 to form a via hole on the first electrode 22, a via hole on the second electrode 23, a via hole on the drain 52, and an opening hole partially exposing the second semiconductor layer 42, as shown in FIG. 4E.

In the present embodiment, the Block S50 includes following steps:

Block S51: forming the second insulating layer 62 on the first insulating layer 61 and the second semiconductor layer 42. The method of forming the second insulating layer 62 includes, but is not limited to, chemical vapor deposition.

Block S52: patterning the second insulating layer 62, the first insulating layer 61, and the gate insulating layer 30 by a mask to form the via hole on the first electrode 22, the via hole on the second electrode 23, the via hole on the drain 52, and the opening hole partially exposing the second semiconductor layer 42.

Figure 4F:
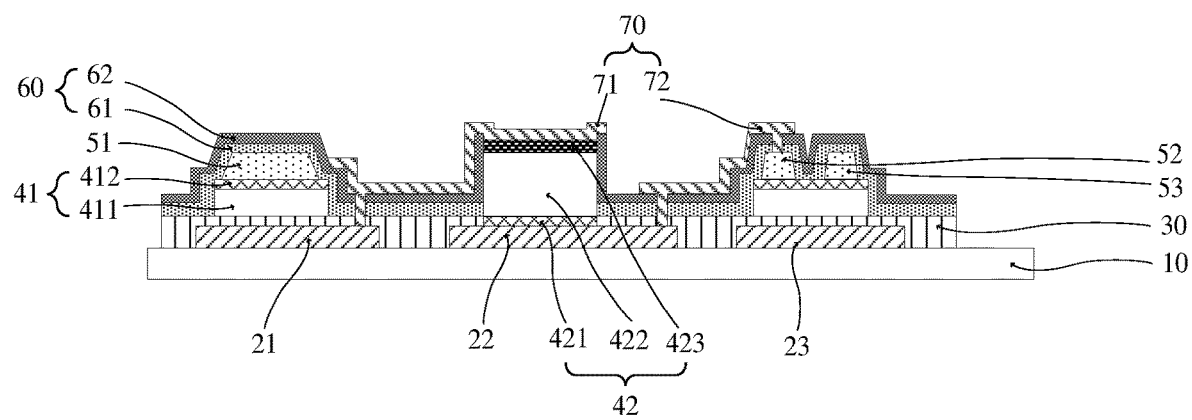

Block S60: forming a transparent electrode layer 70 on the second insulating layer 62 and the second semiconductor layer 42, and patterning the transparent electrode layer 70 to form a first transparent electrode 71 and a second transparent electrode 72, wherein the first transparent electrode 71 is connected to the first electrode 21 by the via hole on the first electrode 21, the second transparent electrode 72 is connected to the second electrode 22 by the via hole on the second electrode 22 and is connected to the drain 52 by the via hole on the drain 52, as shown in FIG. 4F.

In the present embodiment, the method of forming the transparent electrode layer 70 include, but is not limited to, physical vapor deposition, and the material of the transparent electrode layer 70 includes, but is not limited to, indium tin oxide and indium zinc oxide.

In the present embodiment, the manufacturing method of the array substrate further includes:

Block S70: forming a spacer 90 on the substrate 10, and a projection of the spacer 90 projected on the substrate 10 does not overlap with each film layer.

Block S80: forming a protective cover plate 100 on a surface of the spacer 90 away from the substrate 10, and the spacer 90 supports the substrate 10 and the protective cover plate 100.

In the present embodiment, the manufacturing method further includes: forming a light-shielding layer 80 on a surface of the protective cover plate 100 facing the substrate 10, wherein a projection of the third electrode 23 projected on the substrate 10 is located within the light-shielding layer 80.

The light-shielding layer 80 is located between the protective cover plate 100 and the substrate 10, and the light-shielding layer 80 is located on the third electrode 23, wherein a projection of the light-shielding layer 80 projected on the substrate 10 does not overlap with the second electrode 22.

In combination with FIG. 1, in the present embodiment, the array substrate includes a photosensitive unit disposed on the substrate 10, and the photosensitive unit includes a storage capacitor 1100, a switch thin film transistor 1300, and a photosensor 1200 located between storage capacitor 1100 and the switch thin film transistor 1300.

The storage capacitor 1100 includes the first electrode 21, the first semiconductor layer 41, and the fourth electrode 51 arranged in layers. The switch thin film transistor 1300 includes the third electrode 23, the first semiconductor layer 41, the drain 52, and the source 53. The light-shielding layer 80 corresponds to the switch thin film transistor 1300. The photosensor 1200 includes the second electrode 22, the second semiconductor layer 42, and the first transparent electrode 71 arranged in layers.

In summary, an array substrate and a manufacturing method thereof are provided by the present disclosure. The array substrate includes a substrate, a photosensitive unit disposed on the substrate, the photosensitive unit includes a storage capacitor, a switch thin film transistor, and a photosensor located between storage capacitor and the switch thin film transistor, wherein the photosensor is a photodiode structure, and a semiconductor structure in the photosensor includes a N-type heavily doped amorphous silicon layer, an amorphous silicon layer, and a P-type heavily doped amorphous silicon layer arranged in layers.

In the present disclosure, a photodiode structure is used as a photosensor in an array substrate. The semiconductor structure in the photosensor includes a N-type heavily doped amorphous silicon layer, an amorphous silicon layer, and a P-type heavily doped amorphous silicon layer, thereby realizing the integration of photosensors in large-sized devices, the enhancement of device sensitivity, and the reduction of costs.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. An array substrate, comprising:
   a substrate;
   a photosensitive unit disposed on the substrate, wherein the photosensitive unit comprises a storage capacitor, a switch thin film transistor, and a photosensor located between storage capacitor and the switch thin film transistor;
   a first electrode layer disposed on the substrate, wherein the first electrode layer comprises a first electrode, a second electrode, and a third electrode arranged in spaces;
   a gate insulating layer disposed on the first electrode layer;
   a semiconductor layer disposed in the gate insulating layer, wherein the semiconductor layer comprises a first semiconductor layer and a second semiconductor layer, the first semiconductor layer is disposed on the first electrode and the third electrode, and the second semiconductor layer is disposed on the second electrode;
   a second electrode layer disposed on the first semiconductor layer, wherein the second electrode layer comprises a fourth electrode, a drain, and a source, the fourth electrode is disposed on the first electrode, and the drain and the source are disposed on two opposite edge regions of the third electrode;
   an insulating layer disposed on the semiconductor layer; and
   a transparent electrode layer disposed on the insulating layer, wherein the transparent electrode layer comprises a first transparent electrode and a second transparent electrode, the first transparent electrode is connected to the first electrode, and the second transparent electrode is connected to the second electrode and the drain;
   wherein the photosensor is a photodiode structure, and a semiconductor structure in the photosensor comprises a N-type heavily doped amorphous silicon layer, an amorphous silicon layer, and a P-type heavily doped amorphous silicon layer arranged in layers.

2. The array substrate according to claim 1, wherein a thickness of the first electrode layer and a thickness of the second electrode layer both ranges from 500 to 10000 Å.

3. The array substrate according to claim 1, wherein the photosensor comprises the second electrode, the second semiconductor layer, and the first transparent electrode arranged in layers, wherein the second semiconductor layer is a multiple-layered structure comprising the N-type heavily doped amorphous silicon layer, the amorphous silicon layer, and the P-type heavily doped amorphous silicon layer arranged in layers.

4. The array substrate according to claim 1, wherein the storage capacitor comprises the first electrode, the first semiconductor layer, and the fourth electrode arranged in layers, wherein the first semiconductor layer is a multiple-layered structure comprising the amorphous silicon layer and the N-type heavily doped amorphous silicon layer arranged in layers.

5. The array substrate according to claim 1, wherein the switch thin film transistor comprises the third electrode, the first semiconductor layer, the drain, and the source.

6. The array substrate according to claim 5, wherein the third electrode of the switch thin film transistor is connected to a scan signal, the source is connected to a readout signal, the drain is connected to the second electrode of the photosensor and the fourth electrode of the storage capacitor;
   the first electrode of the storage capacitor is connected to a low-potential power source and the first transparent electrode of the photosensor, the fourth electrode of the storage capacitor is connected to the drain of the switch thin film transistor and the second electrode of the photosensor.

7. The array substrate according to claim 1, wherein an opening hole partially exposing the second electrode is defined by the gate insulating layer and the insulating layer, and the second semiconductor layer contacts the second electrode through the opening hole.

8. The array substrate according to claim 1, further comprising: a first barrier layer disposed on the first electrode layer, wherein the first barrier layer comprises a first sub-barrier layer disposed on the first electrode, a second sub-barrier layer disposed on the second electrode, and a third sub-barrier layer disposed on the third electrode.

9. The array substrate according to claim 8, wherein a thickness of the first sub-barrier layer, a thickness of the second sub-barrier layer, and a thickness of the third sub-barrier layer all ranges from 50 to 1000 Å.

10. The array substrate according to claim 1, further comprising: a second barrier layer disposed on the second electrode layer, wherein the second barrier layer comprises a fourth sub-barrier layer disposed on the fourth electrode, a fifth sub-barrier layer disposed on the drain, and a sixth sub-barrier layer disposed on the source.

11. The array substrate according to claim 10, wherein a thickness of the fourth sub-barrier layer, a thickness of the fifth sub-barrier layer, and a thickness of the sixth sub-barrier layer all ranges from 50 to 1000 Å.

12. The array substrate according to claim 1, further comprising: a protective cover plate disposed opposite the substrate, wherein a light-shielding layer is disposed on a surface of the protective cover plate facing the substrate, and a spacer is disposed on a surface of the substrate facing the protective cover plate.

* * * * *